United States Patent [19]

Davies et al.

[11] Patent Number: 5,285,346
[45] Date of Patent: Feb. 8, 1994

[54] CURRENT DRIVEN CONTROL CIRCUIT FOR A POWER DEVICE

[75] Inventors: Robert B. Davies; David F. Mietus, both of Tempe; Paul T. Bennett, Phoenix, all of Ariz.

[73] Assignee: Motorola, Inc., Schaumburg, Ill.

[21] Appl. No.: 806,197

[22] Filed: Dec. 13, 1991

[51] Int. Cl.$^5$ ............................................. H01L 29/78
[52] U.S. Cl. ...................... 361/103; 361/57; 361/100
[58] Field of Search ............ 361/103, 56, 254, 25, 361/27, 37, 57, 93, 100, 101; 357/51, 23.4, 28; 257/107

[56] References Cited

U.S. PATENT DOCUMENTS

| | | | |
|---|---|---|---|
| 4,562,454 | 12/1985 | Schultz et al. | 361/57 |
| 4,698,655 | 10/1987 | Schultz | 361/103 |
| 5,006,736 | 4/1991 | Davies | 307/570 |

Primary Examiner—A. D. Pellinen
Assistant Examiner—S. Jackson
Attorney, Agent, or Firm—Bradley J. Botsch, Sr.

[57] ABSTRACT

A control circuit for protecting a power device has been provided. The control circuit has a thermal shutdown circuit for activating a first SCR when the temperature of the control circuit exceeds a predetermined temperature. Additionally, the control circuit has a DSAT detection circuit for activating the first SCR in response to an external signal. The first SCR is coupled across an input terminal and the common terminal of the control circuit. When the first SCR latches, it functions to subsequently latch a second SCR that is coupled across the output and common terminals. The second SCR functions to rapidly discharge the voltage appearing across the output and common terminals.

Additionally, the control circuit includes an input level sensitive circuit which may be utilized to deactivate various circuitry depending upon the current level of an input signal supplied to the control circuit.

11 Claims, 2 Drawing Sheets

CURRENT DRIVEN CONTROL CIRCUIT FOR A POWER DEVICE

FIELD OF THE INVENTION

This invention relates to circuits, for example, a current driven circuit for controlling the operation of a power device.

BACKGROUND OF THE INVENTION

Power devices are utilized in a plurality of circuit applications that require high voltage and current capability, for example, automotive circuits. However, even power devices must be protected from large surge currents which could destroy the device.

Control circuits are typically utilized to protect power devices by monitoring the current flowing through the power device. Further, most control circuits for power devices are voltage driven. However, the disadvantage of voltage driven control circuits is that they are much more susceptible to voltage transients, for example, transients that are ground bounce induced.

One type of current driven control circuit is fully described in U.S. Pat. No. 5,006,736, having an issue date of Apr. 9, 1991. This patent describes a control circuit for both limiting the gate voltage of a power device and discharging the gate-source capacitance of the power device. However, this patent does not teach utilizing additional control circuitry for detecting over-current or over-temperature conditions of the power device.

Hence, there is a need for an improved current driven circuit for controlling a power device and detecting over-current and over-temperature conditions of the power device.

SUMMARY OF THE INVENTION

Briefly, there is provided a control circuit having an input terminal, an output terminal and a common terminal, comprising a thermal shutdown circuit being coupled between the input terminal and the common terminal, the thermal shutdown circuit providing an output signal when the temperature of the control circuit exceeds a predetermined threshold; a detection circuit coupled between the input terminal and the common terminal and having an input responsive to an external signal, the detection circuit providing an output signal when the external signal exceeds a predetermined voltage; a first SCR having first and second control terminals and first and second terminals, the first control terminal of the first SCR being responsive to the output signal of the thermal shutdown circuit, the second control terminal of the first SCR being responsive to the output signal of the detection circuit, the second terminal of the first SCR being coupled to the common terminal; a second SCR having a first control terminal and first and second terminals, the first control terminal of the second SCR being coupled to the input terminal, the first terminal of the second SCR being coupled to the output terminal, the second terminal of the second SCR being coupled to the common terminal; and a transition circuit coupled to the input terminal, to the output terminal and to the first terminal of the first SCR for providing a current path from the output terminal to the first SCR during the period when the second SCR unlatches.

The present invention will be better understood from the following detailed description taken in conjunction with the accompanying drawings.

DETAILED DESCRIPTION OF THE DRAWINGS

Figure 1:
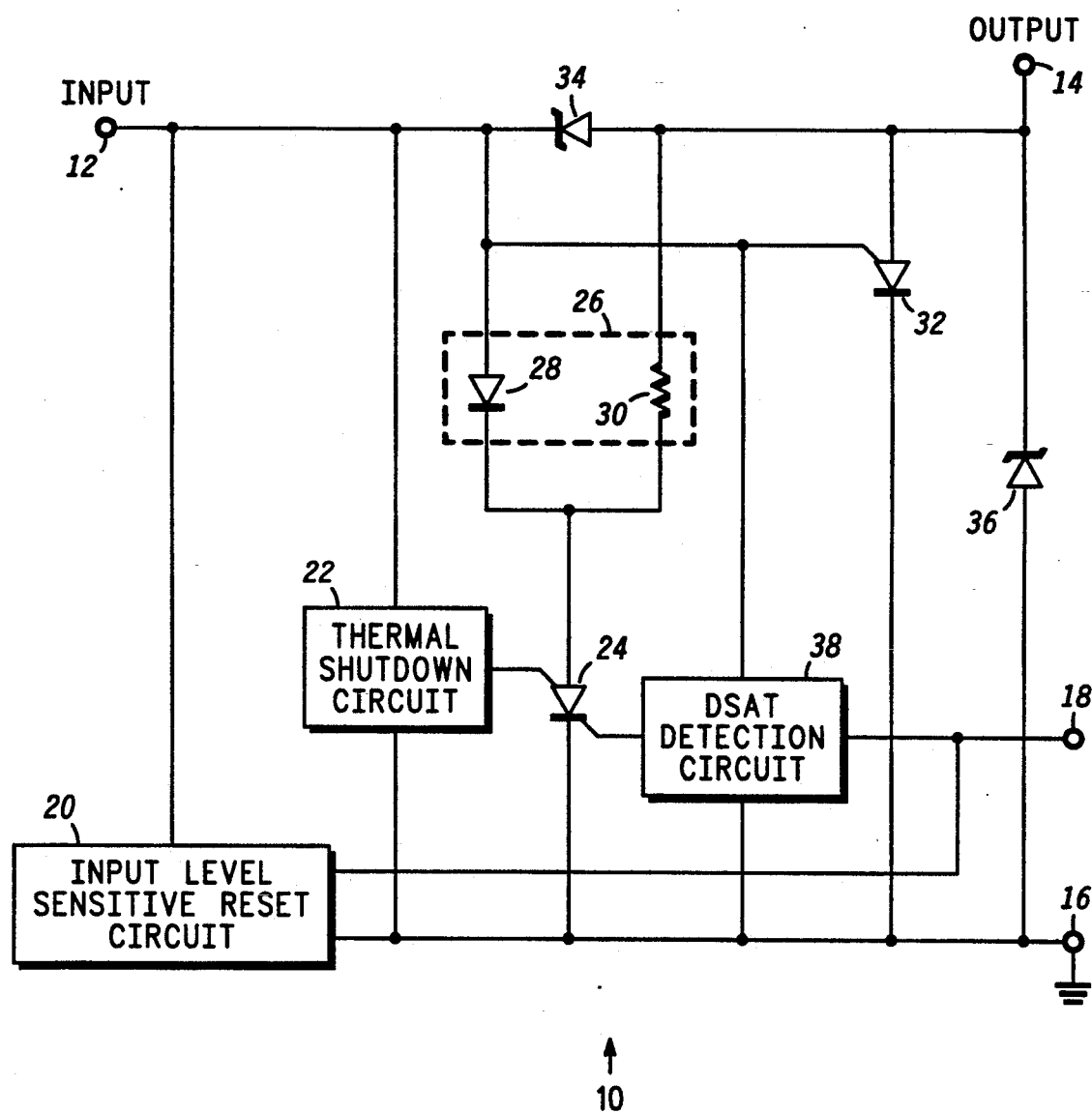
FIG. 1 is a partial schematic/block diagram of a control circuit for controlling the operation of a power device.
Figure 2:
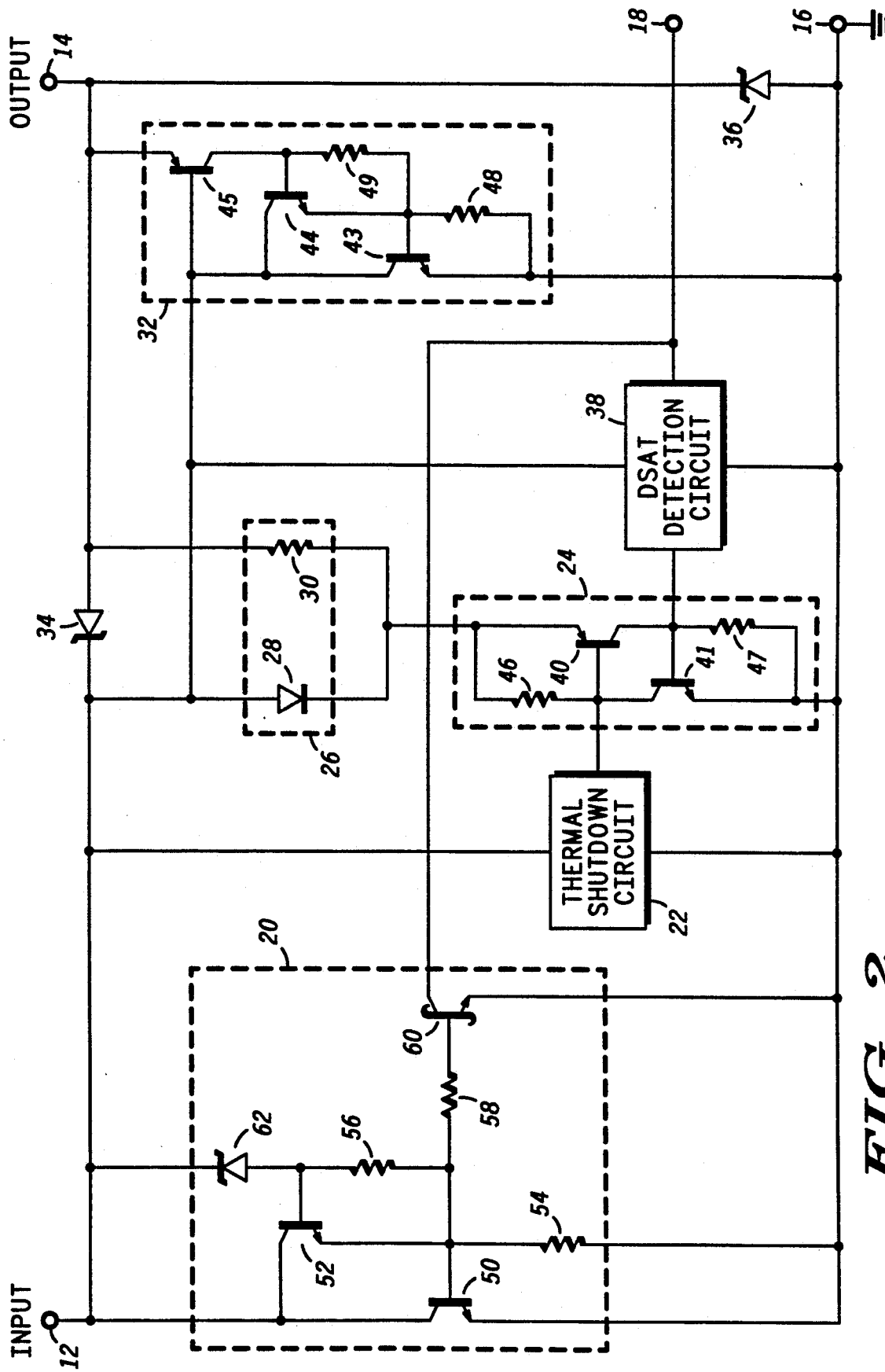
FIG. 2 is a partial schematic/block diagram illustrating the control circuit of FIG. 1 in more detail.

Referring to FIG. 1, there is illustrated control circuit 10 having input terminal 12, output terminal 14, common terminal 16, and current sense terminal 18. In a preferred embodiment, output terminal 14 is typically coupled to a control terminal of an external power device (not shown). One example of the external power device that could be coupled to control circuit 10 is fully disclosed in a pending U.S. application having Ser. No. 07/787,166, filed on Nov. 4, 1991, and assigned to the same assignee of the present invention. Referring to FIG. 2 of the pending application, control node 22' would be coupled to output terminal 14 of control circuit 10 of the subject invention, while detection bias node 28' would be coupled to current sense terminal 18 of control circuit 10 of the subject invention.

A signal applied at input terminal 12 must pass through control circuit 10 before passing through output terminal 14 and to the control terminal of the external power device. In this manner, control circuit 10 controls the operation of the external power device because it controls the signal appearing at the power device's control terminal and shunts the current drive from terminal 14 to terminal 16. Moreover, terminal 16 is typically coupled to ground reference, while terminal 18 may be coupled to receive an external signal, for example, a signal indicative of whether the external power device is operating in saturation.

Control circuit 10 may be fabricated on a separate die from an external power device, and may be inserted within the package of the power device between the control lead and the control terminal of the power device as fully discussed in a pending application having Ser. No. 07/787,165, filed on Nov. 4, 1991, and assigned to the same assignee of the present invention.

Control circuit 10 includes input level sensitive reset circuit 20 coupled between terminal 12 and terminal 16 and having an output coupled to terminal 18.

Thermal shutdown circuit 22 is coupled between input terminal 12 and terminal 16 for providing an output signal to a first control terminal of silicon controlled rectifier (SCR) 24.

Transition compensation circuit 26 includes diode 28 and resistor 30. Diode 28 has an anode coupled to input terminal 12 and a cathode coupled to a first terminal of SCR 24 (anode). Resistor 30 is coupled between the cathode of diode 28 and output terminal 14. The second terminal of SCR 24 (cathode) is coupled to terminal 16.

SCR 32 has a first terminal (anode) coupled to output terminal 14 and a second terminal (cathode) coupled to terminal 16. Further, a first control terminal of SCR 32 is coupled to input terminal 12.

Zener diode 34 is coupled between input terminal 12 and output terminal 14, while zener diode 36 is coupled between output terminal 14 and terminal 16.

DSAT (DeSATuration) detection circuit 38 is coupled between input terminal 12 and terminal 16 for providing an output signal to the second control terminal of SCR 24 in response to signals appearing at terminal 18. It is understood that SCR 24 as well as SCR 32 are latched by predetermined voltage levels appearing at either of their respective first or second control terminals thereby causing a clamping voltage across the respective SCR's first and second terminals.

In operation, a current signal is applied to input terminal 12 which charges the input capacitances of the external power device, through zener diode 34 and terminal 14 until the voltage on the input of the external power device reaches the value of zener diode 36. Moreover, once zener diodes 34 and 36 reach their respective clamped voltages, all of the current then flows through zener diodes 34 and 36 to terminal 16. Thus, the input voltage the external power device is clamped to the breakdown voltage of zener diode 36.

If the temperature of control circuit 10 exceeds a predetermined threshold, the output signal of thermal shutdown circuit 22 provides a signal to the first control terminal of SCR 24 to activate and latch SCR 24. When SCR 24 is activated, the voltage at input terminal 12 begins to decrease and SCR 24 sinks current through diode 28 which is used to pull down the voltage appearing at the first control terminal of SCR 32 thereby latching SCR 32. Moreover, the latching of SCR 32 will rapidly decrease the voltage appearing at terminal 14.

Likewise, SCR 24 can also be latched if the output of DSAT detection circuit 38 provides a predetermined voltage to the second control terminal of SCR 24. Similarly, once SCR 24 is latched, SCR 32 will be subsequently latched as aforedescribed.

Input level sensitive reset circuit 20 is responsive to the current level appearing at input terminal 12 whereby once a predetermined current threshold has been reached, reset circuit 20 forces a predetermined voltage level at the input of DSAT detection circuit 38 which disables DSAT detection circuit 38. In other words, input level sensitive reset circuit 20 disables DSAT detection circuit 38 when the current level at input terminal 12 is above a predetermined threshold, and allows normal operation of DSAT detection circuit 38 when the current level at terminal 12 is below the predetermined threshold. Thus, depending upon the level of the current signal at input terminal 12, reset circuit 20 can perform more than one function.

Referring to FIG. 2, a partial schematic/block diagram of control circuit 10 is shown. It is understood that components shown in FIG. 2 which are similar to components shown in FIG. 1 are identified by like reference numbers. Further, the circuit of FIG. 2 shows SCRs 24 and 32 as well as input level sensitive reset circuit 20 in greater detail than in FIG. 1.

SCR 24 includes transistors 40 and 41. The collector of transistor 41 is coupled to the base of transistor 40 and to the output of thermal shutdown circuit 22 whereby the base of transistor 40 represents the first control terminal of SCR 24. The base of transistor 41 is coupled to the collector of transistor 40 and to the output of DSAT detection circuit 38 whereby the base of transistor 41 represents the second control terminal of SCR 24. The emitter of transistor 41 is coupled to terminal 16, while the emitter of transistor 40 is coupled to the cathode of diode 28. Additionally, resistor 46 is coupled across the base and emitter of transistor 40, and resistor 47 is coupled across the base and emitter of transistor 41.

SCR 32 includes transistors 43, 44 and 45. The emitter of transistor 43 is coupled to terminal 16, and the base of transistor 43 is coupled to the emitter of transistor 44. Further, the collector of transistor 43 is coupled to the collector of transistor 44 and to the base of transistor 45. The base of transistor 44 is coupled to the collector of transistor 45, while the emitter of transistor 45 is coupled to output terminal 14. It is understood the base of transistor 45 is the first control terminal for SCR 32. Additionally, resistor 48 is coupled across the base and emitter of transistor 43, and resistor 49 is coupled across the base and emitter of transistor 44. Resistors 48 and 49, and resistors 46 and 47 are utilized to prevent leakage current from latching SCR's 32 and 24, respectively.

Input level sensitive reset circuit 20 includes transistor 50 having an emitter coupled to terminal 16 and a base coupled to the emitter of transistor 52. The collector of transistor 50 is coupled to the collector of transistor 52. Resistor 54 is coupled between the base of transistor 50 and terminal 16. Resistor 56 is coupled between the base of transistor 52 and the base of transistor 50. Resistor 58 is coupled between the base of transistor 50 and the base of Schottky clamped transistor 60 to provide isolation between the two bases. The base of transistor 52 is coupled to the anode of zener diode 62, and the cathode of zener diode 62 is coupled to input terminal 12. Schottky clamped transistor 60 has an emitter coupled to terminal 16, and a collector coupled to the input of DSAT detection circuit 38.

SCR 32 may be called the output SCR, while SCR 24 may be called the memory SCR. Additionally, SCR 32 may be designed to operate at a substantially higher current than SCR 24. Thus, SCR 24 is less sensitive to voltage variations, but SCR 32 is primarily utilized to rapidly decrease the voltage appearing at terminal 14.

It is important to note that SCR 32 has a forward voltage thereacross which is taken from the emitter of transistor 43 to the emitter of transistor 45 and is substantially equal to two base emitter voltages ($V_{BE(43)} + V_{BE(44)}$) plus a transistor saturation voltage ($V_{CE(45)}$).

On the other hand, memory SCR 24 has a forward voltage thereacross which is taken from the emitter of transistor 41 to the emitter of transistor 40 and is substantially equal to one base emitter voltage ($V_{BE(41)}$) plus a transistor saturation voltage ($V_{CESAT(40)}$).

In operation, SCR 24 can be latched by the output of thermal shutdown circuit 22 applying a predetermined voltage to the base of transistor 40 thereby turning on transistor 40. Additionally, SCR 24 can be latched by the output of DSAT detection circuit 38 by applying a predetermined voltage to the base of transistor 41 to turn on transistor 41. Once SCR 24 is latched, the current at input terminal 12 is shunted to terminal 16 through SCR 24 and diode 28, and the voltage at terminal 12 decreases from the value of the voltage determined by zener diode 36 plus zener diode 34 ($V_{Z(36)} + V_{Z(34)}$) to two base-emitter voltages plus a transistor saturation voltage ($V_{D28} + V_{BE(41)}) + V_{CESAT(40)}$).

Shortly after SCR 24 becomes latched, the voltage at the anode of diode 28 (input terminal 12) decreases to a predetermined voltage thereby turning on transistor 45 of output SCR 32. That is, memory SCR 24 sinks current through diode 28 which is used to pull down the base of transistor 45 thereby latching (firing) output SCR 32. Because SCR 32 is designed to have a substantially larger operating current than SCR 24, once SCR 32 latches, the voltage appearing at output terminal 14 decreases at a substantially faster rate. Thus, SCR 24, which is a smaller and lower current SCR thereby being less sensitive to dV/dt variations occurring between input terminal 12 and common terminal 16, initially turns on and begins decreasing the voltage appearing across input terminal 12 and common terminal 16. SCR 32 subsequently turns on as a result of SCR 24 being latched and functions to rapidly discharge the input capacitances of the external power device and, thus, decreasing the voltage appearing between terminals 14 and 16.

In particular, as the voltage at output terminal 14 decreases to a voltage substantially equal to two base emitter voltages plus a transistor saturation voltage ($V_{BE(43)} + V_{BE(44)} + V_{CESAT(45)}$), SCR 32 begins to unlatch. At this time, the voltage at the base of transistor 45 is substantially equal to a base-emitter voltage plus a saturation voltage ($V_{BE(43)} + V_{CESAT(44)}$). It should be noted that the only supply of electrical charge to provide current flow through SCR 32 is stored within the input capacitances of the external power device.

However, it must be realized that memory SCR 24 is still active because its forward turn on voltage is only one base emitter voltage plus a saturation voltage. Thus, the voltage at the emitter of transistor 40 is substantially equal to $V_{BE(41)} + V_{CESAT(40)}$. Assuming that all transistors have substantially equal base-emitter voltages and collector-emitter saturation voltages, SCR 24 will remain latched by a current that flows from the output terminal 14 through resistor 30 and subsequently through memory SCR 24. It is important to realize that this current flow is made possible because the on-voltage of SCR 32 is greater than the on-voltage of SCR 24. Further, at this time the voltage across diode 28 is substantially equal to zero and diode 28 is momentarily turned off. But, memory SCR 24 remains latched during this transition period due to the current flow from output terminal 14 through resistor 30 to SCR 24. Once this transition period has elapsed, transistor 45 is rendered non-operative and current supplied through input terminal 12 can flow through diode 28 thereby maintaining the latched memory state of SCR 24. Further, the only way to unlatch (reset) memory SCR 24 is to disable the input current applied at input terminal 12.

In summary, what has been shown is a low current memory SCR latch (24) which when activated subsequently activates and latches a higher current output SCR (32). Because the output SCR has a greater forward voltage drop than the memory SCR and because resistor 30 provides a current path for the stored charge from terminal 14 to SCR 24, the latching of memory SCR 24 is maintained during the transition period of SCR 32 going from a latched state to an unlatched state. Thus, SCR 24 remains latched even after SCR 32 is unlatched. In maintaining the latched condition of SCR 24, input current appearing at input terminal 12 is shunted through diode 28 and SCR 24 to common terminal 16.

Input level sensitive reset current 20 functions to sense a portion of the current level appearing at input terminal 12 and depending upon the current level, reset circuit 20 will disable DSAT detection circuit 38. In particular, once the voltage appearing at terminal 12 is charged to a predetermined voltage, for example, the voltage across zener diode 36 plus the voltage across zener diode 34, current is then allowed to flow through zener diode 62 which is designed to have a voltage drop substantially equal to the sum of the voltage drops across zener diodes 34 and 36 less two base emitter voltages (associated with transistors 50 and 52). This, in turn, will render transistors 52 and 50 operative. Resistors 56 and 54 are chosen to determine the current desired to sequentially render transistors 52 and 50 operative.

The current flowing through transistor 50 is then mirrored to Schottky clamped transistor 60 by a ratio of their base-emitter junction areas, for example, 100:1. Therefore, when the input current flowing at input terminal 12 exceeds a predetermined threshold, the current flowing through transistor 50 is mirrored into transistor 60 thereby rendering transistor 60 operative and forcing the collector of transistor 60 to a Schottky clamped voltage, for example, 0.3 volts. Transistor 60 functions to force the input of DSAT detection circuit 38 to the collector voltage of transistor 60 thereby disabling DSAT detection circuit 38.

However, if the input current flowing at input terminal 12 is below the predetermined threshold, transistor 60 will not be rendered operative, and the input of DSAT detection circuit 38 will be responsive to the voltage level appearing at terminal 18. That is, DSAT detection circuit 38 will be allowed to operate normally. Thus, in response to the current level flowing at input terminal 12, input level sensitive reset circuit 20 is utilized to reset, or render inoperative, DSAT detection circuit 38 by forcing a predetermined voltage at its input.

By now, it should be apparent from the forgoing discussion that a novel control circuit for protecting a power device has been provided. The control circuit includes a thermal shutdown circuit for activating a first SCR when the temperature of the control circuit exceeds a predetermined temperature. Additionally, the control circuit includes a DSAT detection circuit for activating the first SCR in response to an external signal. The first SCR is coupled across an input terminal and a common terminal of the control circuit. When the first SCR latches, it functions to initiall decrease the voltage appearing across the input and common terminals of the control circuit and to subsequently latch a second SCR that is coupled across the output and common terminals. The second SCR rapidly decreases the voltage appearing across the output and common terminals.

Additionally, the control circuit includes an input level sensitive circuit which may be utilized to deactivate various circuitry depending upon the current level of an input signal supplied to the control circuit.

While the invention has been described in conjunction with the specific embodiments thereof, it is evident that many alterations, modifications, and variations will be apparent to those skilled in the art in the light of the foregoing description. Accordingly, it is intended to embrace all such alterations, modifications, and variations in the appended claims.

What we claim is:

1. A control circuit having an input terminal, an output terminal and a common terminal, comprising:
   thermal shutdown circuit means being coupled between the input terminal and the common terminal, said thermal shutdown circuit means providing an output signal when the temperature of the control circuit exceeds a predetermined threshold;

a first SCR having at least one control terminal and first and second terminals, said at least one control terminal of said first SCR being responsive to said output signal of said thermal shutdown circuit means, said second terminal of said first SCR being coupled to the common terminal;

a second SCR having a first control terminal and first and second terminals, said first control terminal of said second SCR being coupled to the input terminal, said first terminal of said second SCR being coupled to the output terminal, said second terminal of said second SCR being coupled to the common terminal; and transition means coupled to the input terminal, to the output terminal and to said first terminal of said first SCR for providing a current path from the output terminal to said first SCR during the period when said second SCR unlatches;

a first zener diode having an anode and a cathode, said anode of said first zener diode being coupled to the output terminal, said cathode of said first zener diode being coupled to the input terminal; and a second zener diode having an anode and a cathode, said anode of said second zener diode being coupled to the common terminal, said cathode of said first zener diode being coupled to the output terminal.

2. The control circuit according to claim 1 wherein said transition means includes:
 a diode having an anode and a cathode, said anode being coupled to the input terminal, and said cathode being coupled to said first terminal of said first SCR;
 a first resistor coupled between said first terminal of said first SCR and the output terminal.

3. A control circuit having an input terminal, an output terminal and a common terminal, comprising:
 a detection circuit coupled between the input terminal and the common terminal and having an input responsive to an external signal, said detection circuit providing an output signal when said external signal exceeds a predetermined voltage;
 a first SCR having at least one control terminal and first and second terminals, said at least one control terminal of said first SCR being responsive to said output signal of said detection circuit, said second terminal of said first SCR being coupled to the common terminal;
 a second SCR having a first control terminal and first and second terminals, said first control terminal of said second SCR being coupled to the input terminal, said first terminal of said second SCR being coupled to the output terminal, said second terminal of said second SCR being coupled to the common terminal; and
 transition means coupled to the input terminal, to the output terminal and to said first terminal of said first SCR for providing a current path from the output terminal to said first SCR during the period when said second SCR unlatches;
 a first zener diode having an anode and a cathode, said anode of said first zener diode being coupled to the output terminal, said cathode of said first zener diode being coupled to the input terminal; and
 a second zener diode having an anode and a cathode, said anode of said second zener diode being coupled to the common terminal, said cathode of said first zener diode being coupled to the output terminal.

4. The control circuit according to claim 3 wherein said transition means includes:
 a diode having an anode and a cathode, said anode being coupled to the input terminal, and said cathode being coupled to said first terminal of said first SCR;
 a first resistor coupled between said first terminal of said first SCR and the output terminal.

5. The control circuit according to claim 4 further including:
 input level sensitive circuit means being coupled between the input terminal and the common terminal, said input level sensitive circuit means having an output for providing a signal when a current appearing at the input terminal exceeds a predetermined level, said output of said input level sensitive circuit means being coupled to said input of said detection circuit.

6. A control circuit having an input terminal, an output terminal and a common terminal, comprising:
 input level sensitive circuit means being coupled between the input terminal and the common terminal, said input level sensitive circuit means having an output for providing an output signal when a current appearing at the input terminal exceeds a predetermined level;
 thermal shutdown circuit means being coupled between the input terminal and the common terminal, said thermal shutdown circuit means providing an output signal when the temperature of the control circuit exceeds a predetermined threshold;
 a detection circuit coupled between the input terminal and the common terminal, said detection circuit having an input responsive to an external signal and to said output signal of said input reset sensitive circuit means, said detection circuit providing an output signal when said external signal exceeds a predetermined voltage;
 a first SCR having first and second control terminals and first and second terminals, said first control terminal of said first SCR being responsive to said output signal of said thermal shutdown circuit means, said second control terminal of said first SCR being responsive to said output signal of said detection circuit, said second terminal of said first SCR being coupled the common terminal;
 a diode having an anode and a cathode, said anode being coupled to the input terminal, and said cathode being coupled to said first terminal of said first SCR;
 a first resistor coupled between said first terminal of said first SCR and the output terminal; and
 a second SCR having a first control terminal and first and second terminals, said first control terminal of said second SCR being coupled to the input terminal, said first terminal of said second SCR being coupled to the output terminal, said second terminal of said second SCR being coupled to the common terminal.

7. The control circuit according to claim 6 further including:
 a first zener diode having an anode and a cathode, said anode of said first zener diode being coupled to the output terminal, said cathode of said first zener diode being coupled to the input terminal; and a second zener diode having an anode and a cathode, said anode of said second zener diode being coupled to the common terminal, said cathode of said first zener diode being coupled to the output terminal.

8. The control circuit according to claim 6 wherein the forward on voltage of said second SCR is greater than the forward on voltage of said first SCR.

9. The control circuit according to claim 6 wherein said input level sensitive circuit means includes:
- a first transistor having a collector, a base and an emitter, said collector of said first transistor being coupled to the input terminal;
- a second transistor having a collector, a base and an emitter, said collector of said second transistor being coupled to the input terminal, said base of said second transistor being coupled to said emitter of said first transistor, and said emitter of said second transistor being coupled to the common terminal;
- a third transistor having a collector, a base and an emitter, said collector of said third transistor being coupled to said output of said input reset sensitive circuit means, said emitter of said third transistor being coupled to the common terminal;
- a zener diode having an anode and a cathode, said anode of said zener diode being coupled to said base of said first transistor, and said cathode being coupled to the input terminal;
- a second resistor being coupled between said base of said second transistor and the common terminal;
- a third resistor being coupled between said base of said first transistor and said base of said second transistor; and
- a fourth resistor being coupled between said base of said second transistor and said base of said third transistor.

10. The control circuit according to claim 6 wherein said first SCR includes:
- a first PNP transistor having a collector, a base and an emitter, said emitter of said first PNP transistor being coupled to said first terminal of said first SCR, said base of said first PNP transistor being coupled to said first control terminal of said first SCR;
- a first NPN transistor having a collector, a base and an emitter, said collector of said first NPN transistor being coupled to said base of said first PNP transistor, said base of said first NPN transistor being coupled to said collector of said first PNP transistor and to said second control terminal of said first SCR, and said emitter of said first NPN transistor being coupled to said second terminal of said first SCR;
- a second resistor being coupled across said base and emitter of said first PNP transistor; and
- a third resistor being coupled across said base and emitter of said first NPN transistor.

11. The control circuit according to claim 10 wherein said second SCR includes:
- a second NPN transistor having a collector, a base and an emitter, said emitter of said second NPN transistor being coupled to said second terminal of said second SCR;
- a second NPN transistor having a collector, a base and an emitter, said collector of said second NPN transistor being coupled to said collector of said second NPN transistor and to said first control terminal of said second SCR, said emitter of said second NPN transistor being coupled to said base of said second NPN transistor;
- a second PNP transistor having a collector, a base and an emitter, said collector of said second PNP transistor being coupled to said base of said second NPN transistor, said base of said second PNP transistor being coupled to said collector of said second NPN transistor, and said emitter of said being coupled to said first terminal of said second SCR;
- a fourth resistor being coupled across said base and emitter of said second NPN transistor; and
- a fifth resistor being coupled across said base and emitter of said second NPN transistor.

* * * * *